United States Patent [19]

Henderson

[11] 4,324,285

[45] Apr. 13, 1982

[54] APPARATUS FOR HEATING AND COOLING DEVICES UNDER TEST

[75] Inventor: G. Douglas Henderson, Orlando, Fla.

[73] Assignee: Martin Marietta Corporation, Orlando, Fla.

[21] Appl. No.: 19,684

[22] Filed: Mar. 12, 1979

[51] Int. Cl.³ .............................................. F25B 13/00
[52] U.S. Cl. ........................................ 165/2; 165/30; 62/514 R; 73/15 R; 219/241
[58] Field of Search ................... 165/30, 11 R, 58, 61, 165/2; 73/15 R, 15 A, 15 B, 15.4; 62/372, 514, 384; 324/158 F; 219/209, 210, 241, 449, 460, 464; 174/16 HS; 357/81–83; 361/380–382

[56] References Cited

U.S. PATENT DOCUMENTS

| | | | |
|---|---|---|---|
| 2,915,614 | 12/1959 | Loomis | 219/441 |
| 3,256,734 | 6/1966 | Storke | 219/241 |
| 3,279,239 | 10/1966 | Arends et al. | 73/15 A |
| 3,321,953 | 5/1967 | Roveti | 73/15 R |
| 3,408,565 | 10/1968 | Frick et al. | 324/158 F |
| 3,412,333 | 11/1968 | Frick et al. | 324/158 F |
| 3,533,274 | 10/1970 | Bishop et al. | 73/15 A |
| 3,702,932 | 11/1972 | Tanner et al. | 62/384 X |
| 3,710,251 | 1/1973 | Hagge et al. | 324/158 F |
| 3,979,671 | 9/1976 | Meeker et al. | 324/158 F |
| 4,134,447 | 1/1979 | Jennings et al. | 165/30 |

*Primary Examiner*—Albert W. Davis
*Assistant Examiner*—Margaret A. Focarino

*Attorney, Agent, or Firm*—Julian C. Renfro; Gay Chin

[57] ABSTRACT

Apparatus having a high temperature probe and a low temperature probe, with each probe adapted to make thermal contact with a microelectronic device under test for sequentially heating the device first to a preselected high temperature and then cooling the device to a preselected low temperature. A control system is provided, connected to each of the probes by a small diameter, flexible cable. Each probe is a small, box-like structure having a heat sink as a base, a resistance heater attached to the heat sink, and a heat-sensing diode embedded in the heat sink. The control system senses the heat sink temperature and controls current through the heater to maintain the heat sink at a preselected temperature. The high temperature probe is placed on the top surface of a device under test and serves to add heat quickly thereto to bring the device to a preselected temperature above ambient. The low temperature probe includes a reservoir in contact with its heat sink for holding chips of dry ice, and when the latter probe is placed on the top surface of a device under test, the sublimating dry ice removes heat from the device. The heater portion of the low temperature probe serves to add heat to its heat sink when the device tends to become cooler than a preselected below-ambient temperature. An indicator is utilized to read the heat sink temperature of the probe in use at a given instant.

17 Claims, 8 Drawing Figures

U.S. Patent  Apr. 13, 1982  4,324,285
FIG. 1
FIG. 2
FIG. 3
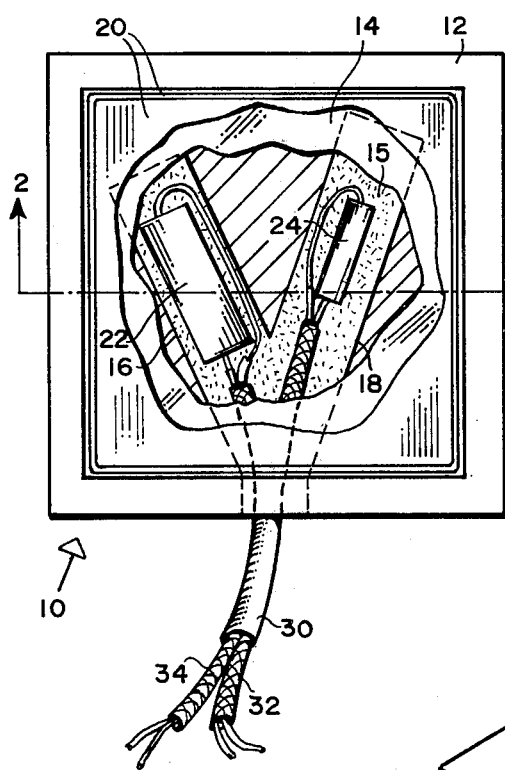
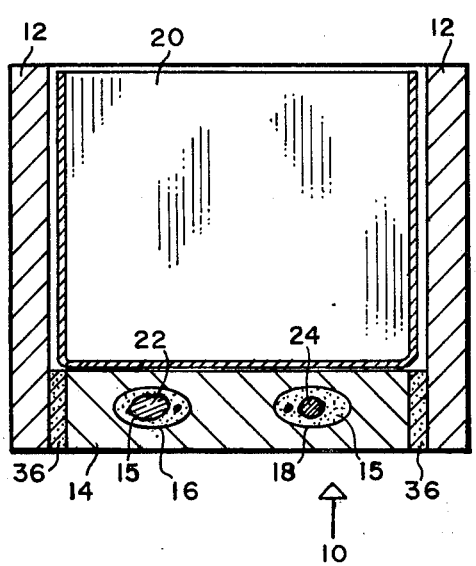
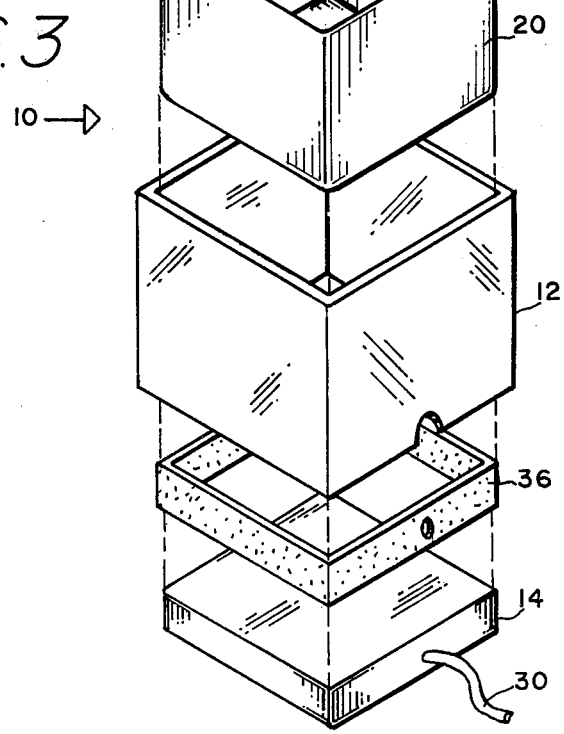

APPARATUS FOR HEATING AND COOLING DEVICES UNDER TEST

BACKGROUND OF THE INVENTION

1. Field of the Invention

The invention relates to test equipment for heating and cooling of microelectronic devices to precise temperatures while under electrical test, and specifically to apparatus for rapidly bringing microelectronic devices to selected high or low temperatures.

2. Description of the Prior Art

Microelectronic circuits in production must be tested to determine their characteristics over specified extremes of temperature. For example, such circuits for military applications may require testing at −55° C. and at +125° C. Equipments available in the past for maintaining circuits under test at such temperatures generally fall into two classes: chambers, such as ovens and refrigerators, into which the circuits under test are placed; and jigs or fixtures arranged to hold the circuits with temperature controlled gases or liquids circulated in or around the fixture.

Typical test chambers are disclosed by Frick et al. in U.S. Pat. Nos. 3,408,565 and 3,412,333. The fluid transfer testers are illustrated by U.S. Pat. No. 3,710,251 to Hagge et al. which teaches use of dry nitrogen; and Pat. No. 3,979,671 to Melker et al. describing the use of liquid injection for controlling temperature of a semiconductor chip. Each of such prior art equipments is expensive, large, and inconvenient for rapid testing. To obtain low temperatures, refrigeration equipment has been necessary, which is inherently slow and requires frequent attention and maintenance. Thus, the need clearly exists for a low-cost, easy to use, and fast response device-under-test (D.U.T.) temperature controller.

SUMMARY OF THE INVENTION

This invention is a novel temperature controller for devices under test that is extremely simple, convenient to use, and capable of quickly bringing the unit under test to the desired temperature. My D.U.T. temperature controller may be constructed at a fraction of the cost of units involving fluid heat transfer and refrigeration units.

The D.U.T. temperature controller consists of two temperature heads or probes which may be in the form of small metallic box-like structures with thermal masses large compared to the mass of the units to be tested. A typical size of a head is $1\frac{1}{2}'' \times 1\frac{1}{2}'' \times 1\frac{1}{4}''$. To obviate the need for cumbersome fixtures to maintain the probes in contact with the case of a D.U.T., this typical size and shape provides adequate balance to permit a probe to rest on the top of a case during tests. Additionally, the weight of each probe is sufficient to allow gravity to maintain good thermal contact between the probe and case when the probe is placed thereon. The high temperature probe includes a small heater element and a diode heat sensor. A small diameter flexible cable connects the probe to a control and monitor section. A temperature reference diode, an operational amplifier, and a heater proportional control amplifier are utilized in combination with the high temperature head elements to monitor its temperature and to control the temperature within very close limits to a selected high temperature.

The cold probe is of similar construction to the high temperature probe but has a reservoir for accepting dry ice. As the dry ice sublimates, it can reduce the temperature of the cold head to near −65° C.; however, the heating element is controlled by its control and monitor section to hold the temperature to a selected low value.

In operation, the monitor and control section circuit is calibrated for the selected high temperature, for example, 125° C. The operational amplifier circuit and proportional control amplifier represent a tight servo loop to hold the head at the selected temperature. After the head has come up to its set temperature as indicated by the monitor, the microelectronic unit under test is placed in its operating jig, with its case in a horizontal plane.

The high temperature probe is placed on the case where it is held by gravity in a heat transfer relationship to the device under test. The base section of the head represents a heat sink, and as heat is drawn from its thermal mass by the microcircuit under test, a slight dip in temperature on the monitor indicator will be noted. The control circuit then functions to increase the current in the heater element sufficient to replace the lost heat. The monitor indicator will return to its preset voltage after about 60 seconds, and the test can proceed.

For low temperature testing, preferably chips of dry ice are placed in the cold head reservoir, and as it sublimates, the temperature of the probe will drop. Assuming, for example, that a low temperature of −55° C. is desired. The monitor and control circuits are calibrated for that temperature and will keep the cold head heater off until the temperature approaches the preset value. At that point, current will begin to flow through the cold head element causing the temperature to cycle about and stabilize at −55° C. as the dry ice continues to sublimate. After the probe has stabilized at the preset low temperature, it is placed on the device under test. Heat is drawn from the microcircuit by the thermal mass of the cold head, causing a slight increase in the temperature monitor reading. However, this heat is quickly absorbed by the dry ice, bringing the indicator back to the preset value in about 70 seconds, and the device tests can then proceed. During a series of tests, the dry ice may be easily replenished as it is consumed.

The present invention thus provides a set of small, easily used temperature probes that will bring microelectronic circuits under test to a selected temperature quickly without use of bulky and difficult-to-use refrigeration systems and heating chambers. The control circuits hold the units under test within very narrow tolerances and are easily calibrated for desired high and low temperatures. No inconvenient gases or liquids are required as in some prior art systems.

Accordingly, it is a principal object of this invention to provide apparatus for bringing microelectronic devices under electrical test to selected high and low temperatures quickly and conveniently.

It is another object of the invention to provide a D.U.T. temperature controller having separate hot and cold heads.

It is yet another object of the invention to provide a low cost D.U.T. temperature controller having small, easily handled hot and cold heads.

It is still another object of the invention to provide a D.U.T. temperature controller of convenient and economical construction, that does not require the use of refrigeration systems or holding fixtures.

It is a further object of the invention to provide a D.U.T. temperature controller of compact size that will maintain its hot and cold heads at selected temperature within very close tolerances.

It is still a further object of the invention to provide a D.U.T. temperature controller having a monitor to provide the operator with an indication when the device under test is at the selected test temperature.

It is yet a further object of the invention to provide a D.U.T. temperature controller comprising no moving parts, solid state monitor and control circuits, and having high reliability with minimum maintenance required.

These and other objects and advantages of the invention will be apparent from the following detailed description with reference to the drawings.

BRIEF DESCRIPTION OF THE DRAWINGS

FIG. 1 is a top view of a preferred construction of a cold probe in accordance with this invention, with the bottom of the reservoir and the heat sink base partially cut away to show the heater element and heat sensor;

FIG. 2 is a sectional view of the cold probe of FIG. 1;

FIG. 3 is an exploded perspective view of the cold probe of FIG. 1;

DETAILED DESCRIPTION OF THE PREFERRED EMBODIMENT

Figure 4:
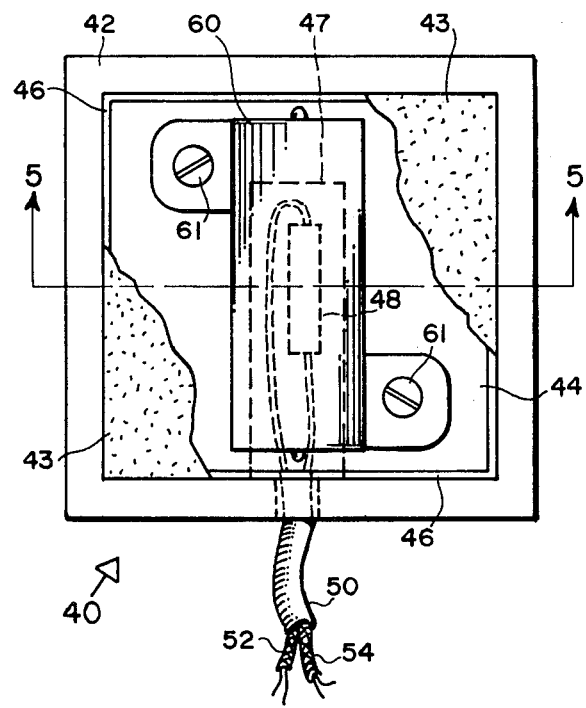
FIG. 4 is a top view of the high temperature probe of the invention, with the potting compound cut away to show the heater element and the heat sink base.

The present invention utilizes two temperature heads or probes, one for producing a high temperature and another for producing a low temperature. Referring to FIGS. 1, 2 and 3, details of a preferred implementation of a cold probe 10 in accordance with the invention is shown. The size of the head 10 may be selected in accordance with the size of microelectronic devices to be tested; however, a box having dimensions of $1\frac{1}{2} \times 1\frac{1}{4} \times 1\frac{1}{4}$ inches has been found well suited for use with encapsulated LSI and integrated circuits. A heat sink base 14, which may be of aluminum with a thickness of $\frac{1}{4}$ inch as shown in FIGS. 1 and 2, has a first cavity 16 for accepting heating element 22, and a second cavity 18 for accepting heat sensor diode 24, effectively embedding diode 24 in heat sink 14. The heat sink 14 is preferably slightly larger in area than the contact area for the D.U.T. Heating element 22 may be a 20 ohm, 6 watt metal-encased resistor, and heat sensor 24 may be a 1 N 4153 diode. Heater 22 and diode 24 are secured in the cavities by electrically insulative, heat-conductive epoxy 15.

A light weight flexible cable 30 connects the cold probe to its associated monitor and control circuits with shielded cable 34 connecting to heater 22 and shielded cable 32 connecting to diode 24.

Outside shell 12 may be formed from $\frac{1}{8}$" wall aluminum box tubing and is insulated from heat sink base 14 by fiberglass separator 36. A cup 20 is inserted in shell 12 with its bottom surface in firm contact with heat sink base 14. Cup 20 forms a reservoir for holding dry ice chips during operation of the invention.

FIG. 3 shows, in exploded view, the assembly of heat sink base 14, fiberglass separator 36, shell 12, and cup 20.

Figure 5:
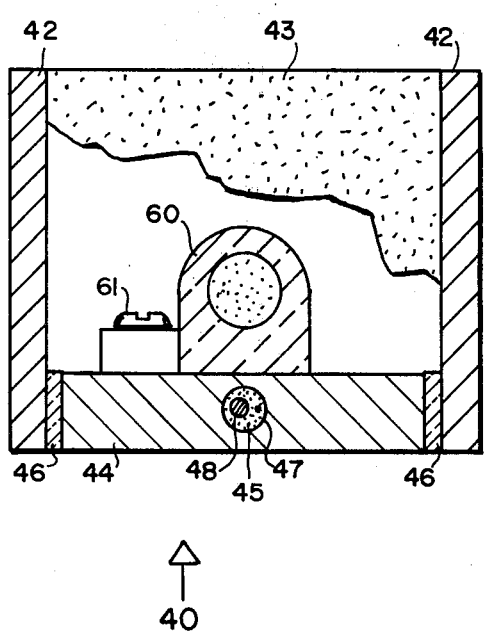
FIG. 5 is a sectional view of the high temperature probe of FIG. 4.
Figure 6:
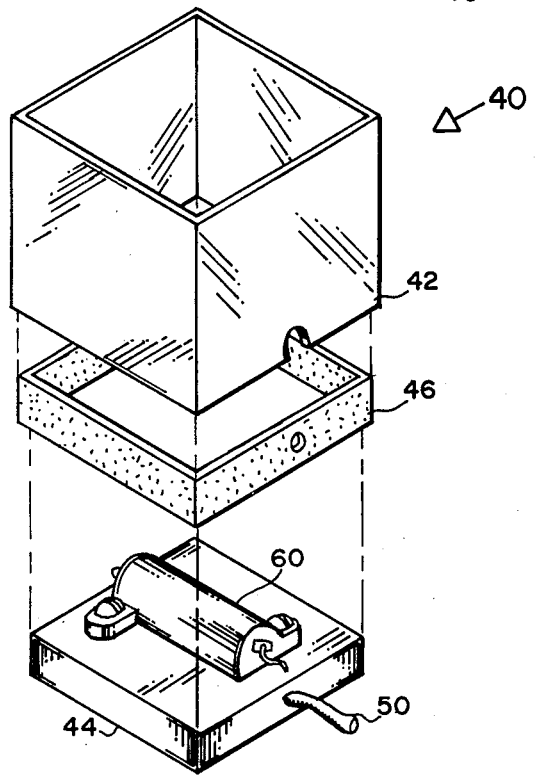
FIG. 6 is an exploded perspective view of the high temperature probe of FIG. 5.

Turning now to FIGS. 4, 5 and 6, the preferred embodiment of the high temperature probe or head 40 is illustrated. The construction is similar to that of cold probe 10 with the same general size; however, a larger heating element is required. Heat sink base 44 may be $\frac{1}{4}$" thick aluminum approximately $1\frac{1}{4} \times 1\frac{1}{4}$ inches and contains heat sensor diode 48 in cavity 47. The exact size of heat sink 44 is determined from the size of the devices to be tested. Electrically insulative, heat conductive epoxy 45 is used to secure diode 48 effectively embedded in heat sink 44. Heating element 60 may be a 16 ohm, 20 watt metal encased resistor affixed to heat sink base 44 by screws 61. Outside shell 42, formed from $\frac{1}{8}$" wall, aluminum box tubing is separated from base 44 by fiberglass separator 46.

FIG. 6 shows an exploded view of hot probe 40 illustrating the assembly of heat sink base 44 with resistor 60, separator 46, and shell 42. After assembly, shell 42 may be filled with a ceramic potting compound 43 such as Sauerisen 33. Lightweight, flexible cable 50, consisting of shielded heater cable 52 and sensor diode cable 54, connects hot probe 40 to the monitor and control circuits.

Figure 7:
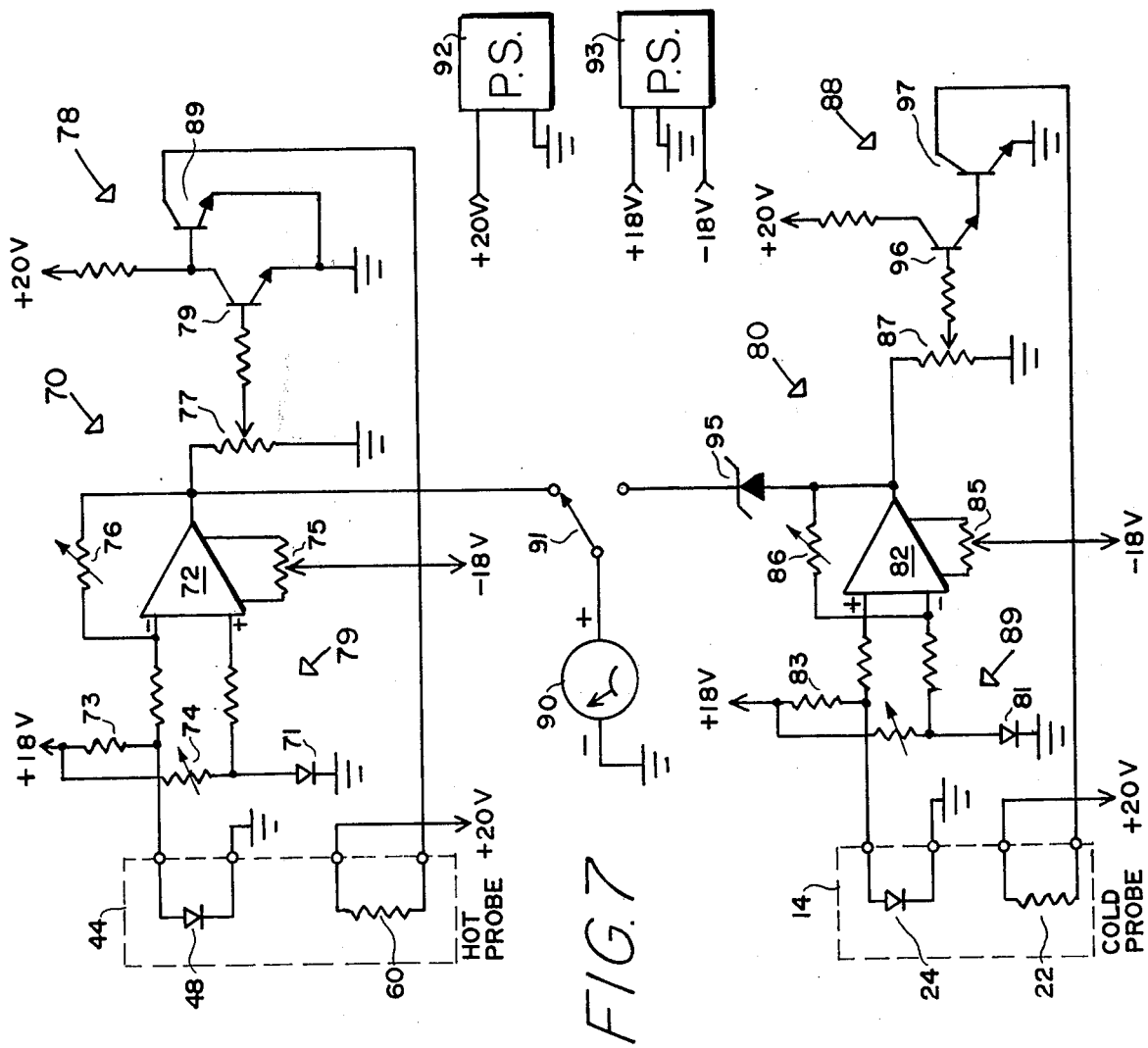
FIG. 7 is a schematic diagram of the monitor and control sections of the invention.

Having described the temperature probe means, the monitor and control circuits will be explained with reference to the schematic diagram of FIG. 7. The hot and cold sections of the monitor/control system of FIG. 7 are essentially the same, but are calibrated for different control temperatures. Thus, the "hot" section 70 will be described in detail and the "cold" section 80 variations specifically discussed. Although particular circuit elements are recited, these are for exemplary purposes only and many other types and values of elements may also be used in accordance with the invention.

The high temperature heat sink 44 contains heat sensor diode 48, which may be a 1 N 4153 semiconductor diode forward biased at about 1 ma from a +18 volt supply through resistor 73. As may be noted, diode 48 is in a bridge circuit 79 with diode 71, also a 15 N 4153, biased through adjustable potentiometer 74. When both diodes 48, 71 are held at ambient temperature, for example at 23° C., pot 74 is adjusted to produce the same forward voltage for diode 71 or for diode 48 as evidenced by exact balance of the bridge 79. Operational amplifier 72 which is preferably an Lm 741, measures the differential voltage across the bridge circuit 79, which will be zero when both diodes are at ambient. The amplifier is thus working in a floating mode with respect to the power supply 93 ground potential. The gain of operational amplifier 72 is set by dc feedback potentiometer 76 and may be set to produce an output voltage change of exactly 100 mv/deg.C. rise in heat sense diode 48. For the diode and bias current specified above, the diode 48 voltage changes at the rate of $-2$ mV/deg.C.; therefore, if the gain of operational amplifier 72 is set at 50, a one degree change in the heat sense diode 48 will give +100 mv change in the output.

For the example of both sense diode 48 and reference diode 71 being at ambient temperature, the differential voltage output of operational amplifier 72 will be zero volts. However, it is desired that meter 90 read the ambient temperature in such case. Therefore, it is necessary to offset the voltage. For a 0-15 volt voltmeter, a direct reading scale may be used; that is, 23° C. may register +2.3 volts. To this end, potentiometer 75 is connected to operational amplifier 72 to provide means of setting the offset voltage to the desired value. The meter 90 may now be used to read ±150° C. by connecting in the proper polarity. Switch 91 therefore connects meter 90 to the hot probe operational amplifier 72 to read positive voltages.

The output voltage from operational amplifier 72 appears across divider potentiometer 77 with its wiper arm connected to amplifier 78. Input transistor 79, which is a switching transistor and may be a 2 N 2222, has a turn-on voltage of about 0.6 V. Potentiometer 77 is set to a point greater than this value when the output voltage is +2.3 volts causing transistor 89, which may be a 2 N 5038, to be on with current flowing in probe heater 60. As this heater current flows, the hot probe temperature rises and the forward voltage of sense diode 48 drops at the approximate rate of −2 mV/deg.C. generating a differential voltage output from operational amplifier 72.

As an example of a particular calibration, assume that the forward voltages of diode 48 and diode 71 are each +0.585 volts at 23° C. ambient and the output of amplifier 72 is +2.3 V. If the hot probe temperature desired is +125° C., potentiometer 77, which may be a ten-turn calibrated type, may be set to 0.6/12.5 of maximum or 4.8%. Since the base voltage of transistor 79 is less than 0.6 volts, that transistor is fully off, transistor 89 is fully on, and maximum current flows through heater 60. Assume the hot probe temperature rises to 73° C. for example, an increase of 50° from ambient. At −2 mV/deg.C., this increase is a change of −100 mV at the input to amplifier 72 and, for a gain of 50, an output of 5 volts. The meter 90 now reads 2.3+5.0 volts or 7.3 volts, indicating 73° C. With potentiometer 77 set at 4.8% of 7.3 volts or 0.35 volts, transistor 79 remains off and full current flows in heater 60.

As the hot probe temperature rises to, say, 113° C., meter 90 will read 11.3 volts and the base voltage of transistor 79 is 0.525 volts and is beginning to turn on, transistor 89 is beginning to turn off, and the current in heater 60 is decreasing. When the temperature of heat sink 44 approaches the desired value of +125° C. the threshold point of transistor 79 is reached, at which slight changes in drive current causes large proportional changes in the heater current. Therefore, only an amount of current flow at +125° C. results that will balance heat loss due to radiation, and conduction to the D.U.T.

When the hot probe is applied to a cold device under test, heat will be suddenly absorbed from the heat sink 44, causing a drop of a few degrees in probe temperature. A large increase in heater current results, quickly returning the probe to the set temperature. As may now be seen, the system represents a tight dc servo loop and has been found to be capable of maintaining the probe temperature (after stabilization) within ±1% of the set temperature. Amplifier 78 may be noted to operate as a switch, turning the heater current full on below about +113° C. and a sensitive proportional control around the examplary set temperature of +125° C.

Monitor and control section 80 for cold probe 14 is essentially identical to hot probe section 70 described above except that it is calibrated to operate below ambient and to hold current through heater 22 off until the desired low temperature of probe 14 is approached. At this point, Darlington amplifier 88 operates as a proportional amplifier, increasing the current through heater 22 as the probe temperature decreases. Meter 90 will read a positive voltage at the output of operational amplifier 82 and is connected thereto by switch 91. Zener 95 which may be a 1 N 746 is used to prevent meter 90 from swinging negative when first switched into the cold probe circuit 80 and the output of operational amplifier 82 has not yet come up to zero volts from −2.3 volts.

For a selected lower temperature of −55° C. as an example, potentiometer 87 is set at 1.2/5.5 of maximum or 21.8% of its maximum output. As the cold probe 14 drops from ambient toward −55°, the difference voltage will go from −2.3 volts to zero volts at 0° C. Assume now that the cold probe temperature has dropped to −45° C., the difference voltage is (23°+45°) (2 mV/deg.C.)=136 mv causing an output change of 6.8 volts. Subtracting the −2.3 volt offset, a reading on meter 90 is therefore 4.5 volts or 45° C. The Darlington circuit 88 is then driven by 21.8% of this voltage or 0.981 volts. This causes input transistor 96 and heater control transistor 97 to begin to turn on. The resulting current through heater 22 slows the rate of cooling as the heat sink 14 temperature approaches −55° C.

At −55° C., the input to current control amplifier 88 is 21.8% of 5.5 volts or 12 volts, causing a substantial current flow through heater 22. This temperature represents an equilibrium point at which the heater supplies the heat required for maintaining the preset temperature during continued sublimation of the dry ice. When the cold probe 10 is placed on a warm device under test, the probe heat sink 14 absorbs the heat therefrom and sensor 24 will sense a slight rise in temperature, causing a reduction in current through heater 22. The dry ice will again cool probe 10 to the −55° C. equilibrium point.

As may now be seen, the control circuit 80 provides a very accurate dc cold temperature control loop. A typical response during a typical device test has been found to be approximately 60 seconds for the −55° C. equilibrium point to be obtained; thus, the device is brought to the test temperature quickly and conveniently.

The hot and cold control systems, as may be recognized, are direct coupled from their sense diodes through the feedback loops to the heat elements and therefore have a frequency response down to direct current.

The two reference diodes 71, 81 are installed in a heat sink in the controllor chassis and room air is circulated around the heat sink, resulting in a stable ambient reference temperature. If the heat sink temperature changes slightly, the reference diodes will sense such change, the control circuits respond, and the meter will still read the correct probe temperatures.

Although not illustrated, it is desirable to cover the four sides of each probe 10, 40 with thermal insulating material such as asbestos cloth to allow handling of the probe heads without danger. Additionally, such cover reduces frost formation on the outside of cold probe 10.

Figure 8:
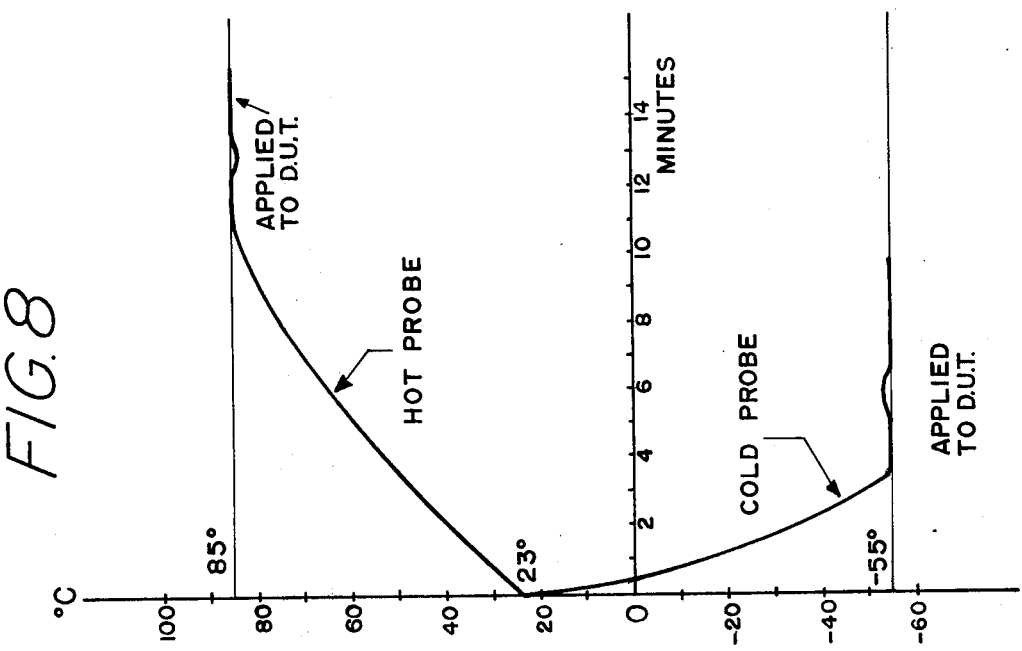
FIG. 8 is a plot of typical temperature variations of the hot and cold probes under start up and operate conditions.

FIG. 8 shows a plot of the variations in temperature of the heat sinks 14 and 44 of probes 10 and 40 for a typical apparatus constructed in accordance with the invention. The unit was calibrated for an ambient temperature of 23° C., a high test temperature of 85° C. and a low test temperature of −55° C. The graph indicates the times required to reach the desired preset temperatures from initial turn on of the apparatus, and the times for the heat sinks to stabilize after being placed on a typical device-under-test.

Starting with an ambient temperature of 23° C., the hot probe heat sink is seen to stabilize at 85° C. in approximately 11.5 minutes. Applying the hot probe to a D.U.T., a slight drop in temperature of about 2 degrees occurred, and stabilized at 85° C. in about 60 seconds from application. The cold probe heat sink reached its preselected temperature of −55° C. in about 4 minutes from 23° ambient. Applying the cold probe to a D.U.T. resulted in about 2 degrees rise and about 70 seconds to restabilize at −55°. Thus, once the probes have initially attained their preselected test temperatures, a device under test can be brought to the required temperature in about one minute. The operator may determine from observing the indicator 90 when the D.U.T. and the probe are stabilized so that the electrical testing of the device can proceed. For the unit represented by the graph of FIG. 8, the cycling time between hot and cold tests is thus seen to be on the order of 60-70 seconds.

As will now be recognized, the invention provides a small, easily applied and low cost apparatus to enable microelectronic circuit devices and the like to be quickly and easily brought to selected low and high temperatures during electrical tests of the devices, with the apparatus requiring no refrigeration equipment, nor special chambers. The simplicity of the apparatus insures very high reliability, long life, and freedom from continual maintenance.

It is to be understood that the preferred embodiment described hereinabove is presented for exemplary purposes only and is not to be considered restrictive. Many variations and modifications will be obvious to those of ordinary skill in the art. For example, the specific probe temperatures may be easily set to other values, and the size of the probes may be varied to suit the physical dimensions of the devices to be tested. In addition, other control and monitor circuits may be substituted without departing from the spirit and scope of the invention. As is also obvious, various changes in transistors such as other types and substitution of NPN for PNP, can be made without deviating from the invention.

I claim:

1. Apparatus to cool small microelectronic devices and the like undergoing electrical test thereof comprising:
    (1) self-contained cold temperature probe for contacting a device under test for lowering the temperature thereof, said probe having
        (a) a heat sink adapted to be temporarily disposed in a direct heat transfer relationship to the device under test, said heat sink being slightly larger in area than the contact area of the device under test,
        (b) a box-like structure having said heat sink as its base, said heat sink thermally insulated from the sides of said structure,
        (c) reservoir means disposed with said box-like structure in heat-conductive contact with said heat sink for holding a gas in its frozen, solidified state whereby sublimation of such frozen gas lowers the temperature of said heat sink below the ambient temperature to thereby cause said heat sink to absorb heat from the device under test,
        (d) heater means disposed within said heat sink for maintaining said heat sink at a selected temperature less than ambient and greater than the sublimation temperature of said frozen gas, and
        (e) temperature sensing means disposed within said heat sink for producing an electrical signal proportional to the temperature of said heat sink; and
    (2) control means connected to said heater means and to said temperature sensing means, and responsive to said electrical signal to thereby control said heater means so as to maintain a preselected below-ambient temperature of said heat sink.

2. The apparatus as defined in claim 1 in which said control means includes indicator means for indicating the temperature of said heat sink, thereby permitting an operator to determine when the device under test has attained the preselected temperature.

3. The apparatus as defined in claim 1 including:
    flexible electrical cable connecting said cold temperature probe to said control means; and
    said box-like structure is adapted to rest upon the top surface of the device under test with said heat sink in physical contact with the device under test, said structure having sufficient weight to form good thermal contact between said heat sink and said top surface of the device under test.

4. The apparatus as defined in claim 1 in which said reservoir means is adapted to hold dry ice formed from frozen carbon dioxide.

5. The apparatus as defined in claim 1 in which:
    said temperature sensing means is a probe semiconductor diode biased to produce a potential which varies with the temperature of the diode; and
    said control means includes an electrical bridge circuit connected to said probe diode, a reference semiconductor diode biased to produce a potential which varies with the ambient temperature of said bridge circuit, and amplifier means connected to said bridge circuit and arranged to amplify a signal representative of the difference in temperature of said probe diode and said reference diode.

6. The apparatus as defined in claim 5 in which said probe semiconductor diode is embedded in said heat sink.

7. The apparatus as defined in claim 5 in which said electrical bridge circuit comprises:
    a first leg having the cathode of said probe diode connected to the negative pole of a voltage source, and the anode of said probe diode connected through a first resistor to the positive pole of said voltage source;
    a second leg having the cathode of said reference diode connected to said negative pole, and the anode of said reference diode connected through a second resistor to said positive pole; and
    said amplifier means is a balanced operational amplifier having its negatively polarized input connected to the juncture of said probe diode cathode and said first resistor, and its positively polarized input connected to the junction of said reference diode cathode and said second resistor, whereby said operational amplifier operates above the potential of said negative pole of said voltage source.

8. The apparatus as defined in claim 7 in which said operational amplifier includes:

dc gain control means for calibrating said amplifier to produce a selected voltage gain; and offset voltage control means for calibrating said amplifier to produce a selected voltage output when said probe and reference diodes are at ambient temperature.

9. The apparatus as defined in claim 5 in which said heater means is an electrical resistance and said control means further includes electronic switch means connected to control electrical current to said resistance, said switch means responsive to the amplified output signal of said amplifier means whereby the electrical current through said resistance is controlled to vary in response to such difference in temperature.

10. The apparatus as defined in claim 9 in which said electronic switch means is adapted to cut off electrical current to said resistance over a preselected temperature difference range, and to provide a proportional control of such current when the temperature of said probe is at or near the preselected test temperature.

11. The apparatus as defined in claim 10 in which said control means is a direct coupled feedback control system having a low frequency response extending to direct current.

12. The apparatus as defined in claim 5 in which said control means includes indicator means connected to the output of said amplifier means, said indicator means calibrated to indicate the temperature sensed by said probe diode.

13. The method of performing low temperature electrical tests on microelectronic circuits comprising the steps of:

placing a heat sink in heat transfer contact with the device under test, the heat sink having a heater, and a reservoir containing dry ice;

controlling the heater to achieve a selected equilibrium temperature between the temperature of the dry ice and the ambient temperature;

performing low temperature electrical tests; and removing the heat sink from the device under tests.

14. The method of performing low temperature electrical tests on microelectronic devices comprising the steps of:

placing a small, low temperature probe having a heat sink base in heat transfer contact with a top surface of a device under test, the probe having a reservoir in heat transfer contact with the heat sink and a heater in heat transfer contact with the heat sink;

inserting dry ice in the reservoir;

monitoring the temperature of the heat sink;

permitting the temperature of the heat sink to drop to a point slightly greater than a preselected low test temperature;

energizing and controlling the heater to achieve and maintain the temperature of the heat sink at the preselected low test temperature having a value between the temperature of the dry ice and the ambient temperature;

performing low temperature electrical tests on the device under test; and removing the temperature probe from the device under test.

15. A cold temperature probe for contacting a small microelectronic device to reduce its temperature to a temperature much lower than ambient for testing thereof comprising, a heat sink adapted to be disposed in a heat transfer relationship to a device under test, said heat sink having a device-contacting area slightly larger than the contact area of a device under test, a box-like structure having said heat sink as its base, said heat sink thermally insulated from the sides of said structure, reservoir means in heat-conductive contact with said heat sink for holding frozen and solidified gas whereby sublimation of said frozen gas lowers the temperature of said heat sink below the ambient temperature, and heater means disposed in a heat transfer relationship with said heat sink for controlling the temperature of said heat sink to a selected value between the temperature of said frozen gas and ambient temperature.

16. The cold temperature probe as defined in claim 15 in which said box-like structure is adapted to rest by gravity upon the top surface of the device under test with said heat sink in physical contact and heat transfer relationship with the device under test, said structure having sufficient weight to form good thermal contact between said heat sink and said top surface of the device under test.

17. The cold temperature probe as defined in claim 15 which further comprises temperature sensing and indicating means.

* * * * *